(12) United States Patent
Wong et al.

(10) Patent No.: US 6,223,139 B1
(45) Date of Patent: Apr. 24, 2001

(54) KERNEL-BASED FAST AERIAL IMAGE COMPUTATION FOR A LARGE SCALE DESIGN OF INTEGRATED CIRCUIT PATTERNS

(75) Inventors: Alfred K. Wong, Beacon; Richard A. Ferguson, Pleasant Valley, both of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/153,842

(22) Filed: Sep. 15, 1998

(51) Int. Cl.$^7$ .................................................... G06F 17/50
(52) U.S. Cl. .................... 703/5; 703/2; 416/21; 356/401
(58) Field of Search .................. 703/3, 5, 2; 356/399, 356/401, 340; 716/21

(56) References Cited

U.S. PATENT DOCUMENTS

| 5,631,731 | * | 5/1997 | Sogard | ................................ 356/121 |
| 6,064,486 | * | 5/2000 | Chen et al. | ........................... 356/401 |

OTHER PUBLICATIONS

Max Born, et al, Principles of Optics, "Electromagnetic Theory of Propagation, Interference and Diffusion of Light", Pergamon Press, Sixth Edition, 1980, pp. 528–533.

E. Barouch, et al, "Vector Aerial Image with Off–Axis Illumination" SPIE vol. 1927, Optical/Laser Microlithography VI, 1993, pp. 686–708.

Y. C. Pati, et al, "Phase–shifting masks for microlithography: automated design and mask requirements" Jrl. Optical Society of America, A/vol. 11, No. 9, Sep. 1994, pp. 2438–2452.

SPLAT v5.0 Users' Guide, University of California, Berkeley, Jan. 19, 1995, pp. 1–73.

Nick Cobb, et al, "Fast, Low–Complexity Mask Design" SPIE vol. 2440, Feb. 1995, pp. 313–327.

Y. C. Pati, et al, "Exploiting Structure in Fast Aerial Image Computation for Integrated Circuit Patterns" IEEE Transactions on Semiconductor Manufacturing, vol. 10, No. 1, Feb. 1997, pp. 62–74.

* cited by examiner

Primary Examiner—Kevin J. Teska
Assistant Examiner—Thai Phan
(74) Attorney, Agent, or Firm—H. Daniel Schnurmann

(57) ABSTRACT

A method of simulating aerial images of large mask areas obtained during the exposure step of a photo-lithographic process when fabricating a semiconductor integrated circuit silicon wafer is described. The method includes the steps of defining mask patterns to be projected by the exposure system to create images of the mask patterns; determining an appropriate sampling range and sampling interval; generating a characteristic matrix describing the exposure system; inverting the matrix to obtain eigenvalues as well as the eigenvectors (or kernels) representing the decomposition of the exposure system; convolving the mask patterns with these eigenvectors; and weighing the resulting convolution by the eigenvalues to form the aerial images. The method is characterized in that the characteristic matrix is precisely defined by the sampling range and the sampling interval, such that the sampling range is the shortest possible and the sampling interval, the largest possible, without sacrificing accuracy. The method of generating aerial images of patterns having large mask areas provides a speed improvement of several orders of magnitude over conventional approaches.

8 Claims, 7 Drawing Sheets

PHOTOMASK PATTERNS

EXPOSURE

AERIAL IMAGES

KERNEL-BASED FAST AERIAL IMAGE COMPUTATION FOR A LARGE SCALE DESIGN OF INTEGRATED CIRCUIT PATTERNS

TECHNICAL FIELD

This invention relates generally to the field of photolithography, and more particularly, to the simulation of aerial images during the exposure step of a photo-lithographic process and specifically tailored for the design and fabrication of large scale semiconductor integrated circuits.

BACKGROUND OF THE INVENTION

The photo-lithography process in semiconductor fabrication consists in duplicating desired circuit patterns as best as possible onto a semiconductor wafer. This process, shown in FIG. 1, is conventionally subdivided into three steps: exposure, develop, and etch. The exposure step projects the desired circuit patterns onto a film of photosensitive material commonly referred to as photoresist. The desired circuit patterns are typically represented as opaque (or translucent in some cases) and transparent regions on a template commonly called a photomask. Semiconductor circuits are then repeatedly reproduced from this template by a variety of techniques, among them projection being the most popular for mass production of semiconductor circuits due to its high throughput and relative low cost. In optical photolithography, patterns on the photomask template are duplicated onto the photoresist coated wafers by way of optical imaging through an exposure system. The images of these patterns interact with chemicals in the photoresist, creating latent images. The latent images are, typically, variations in concentration of chemical species which must be developed and, if necessary, transferred onto the wafer. This transferral process is accomplished by the develop and etch steps. In the former, a developer is utilized to discriminately dissolve the photoresist, creating patterns on the photoresist from the latent images which resemble the desired circuit patterns. This discrimination is made possible by the differentiation of dissolution rate due to variations in chemical concentration of the latent images. After developing the photoresist, the patterns are etched, if necessary, onto the wafer and the circuits are fabricated.

As shown in FIG. 2 and of relevance to the discussion to follow, the exposure step is typically divided into two sub-steps: the aerial image formation and the latent image formation previously described. The images that are formed by the exposure system of the photomask template before they interact with the photoresist are the aerial images. Since the template patterns typically have sharp transitions between opaque and clear regions (i.e., sharp corners), and keeping in mind that the exposure system can be viewed as a low pass (spatial frequency) filter, the aerial images resemble but do not exactly replicate the photomask pattern. The sharp edges of the original photomask, shown in more detail in FIG. 3, are distorted by the exposure system, resulting in rounded aerial images. It is important to predict the loss in pattern integrity via computer simulation for efficient process development and improved process latitude.

Aerial image simulators which compute the images generated by optical projection systems have proven to be a valuable tool to improve the state-of-the art in optical lithography for integrated circuit applications. Such simulators have recently found wide-spread application in advanced mask designs, e.g., phase-shifting mask (PSM) design, optical proximity correction (OPC) in automated inspection of PSMs and OPC masks, and in the design of projection optics, e.g., pupil and illumination filters. One of the main challenges to using model-based simulators in integrated circuit (IC) mask applications is the formidable size of the data representing a typical IC pattern. To illustrate this point and considering a moderately sized IC occupying 10 mm×10 mm of silicon with a minimum feature size of 0.25 um, a sparse sample spacing of 25 nm along each side immediately results in $1.6 \times 10^{11}$ points to represent the image of the chip. Hence, it is extremely important in this application to minimize both the number of operations required to compute the image and the memory space needed.

Modeling aerial images has recently become a crucial component of semiconductor manufacturing. Since all steppers employ partially coherent illumination, such modeling is computationally intensive for all but elementary patterns. Known in the art is a spatial eigenvector decomposition computational method for calculating aerial images of integrated circuit masks produced by a partially coherent optical projection system. The method described relies on two tools to realize fast computation: 1) coherent decomposition of partially coherent imaging system models, as described by Y. C. Pati and T. Kailath in the article "Phase-shifting masks for microlithography: Automated design and mask requirements", published in the Journal of the Optical Society of America A, vol. 11, No. 9, pp. 2438–2453, 1994; and 2) the use of "basis" (or building block) images that are well-suited to describe integrated circuit patterns. Examples are submitted wherein aerial images are computed for large mask areas, typically of the order of 100 $\mu$m×100 $\mu$m.

One of the earliest aerial image simulation tools available is a software package known as SPLAT that was developed at the University of California by D. Lee and A. R. Neureuther et al., and fully described in SPLAT v5.0 User's Guide; Berkely Calif., University of California Press, March 1995. SPLAT computes aerial images by frequency domain integration using Hopkins approximation, well known to those skilled in the art. Although SPLAT has been extensively used in conventional lithography simulation, it is incapable of computing images of large masks in a reasonable amount of time. More recently, a number of faster commercial image simulators have been developed. These include, for example, FAIM, which was extended by E. Barouch, et al and described in the article "Vector Aerial Image with Off-Axis Illumination", published in SPIE, Vol. 1927, Optical/Laser Microlithography VI, pp. 686–708, 1993. However, as these are commercial products, no details are available as to the particular methods used to compute the images. The main drawback of SPLAT in IC lithography applications is the large computation time required for large mask areas because its computation time increases as the fourth power of the linear dimension.

The main computational advantage of the inventive method is realized by exploiting the structure inherent in IC pattern definitions, and also a (not so obvious) structure that can be extracted from a partially coherent imaging model. The structure of the image formation model is brought to bear on the problem through a decomposition of partially coherent imaging systems as the incoherent sum of coherent imaging systems, which was introduced by Pati and Kailath. This decomposition immediately reduces the computation to a (small) number of coherent image computations, in which the main factors of the computation are a matrix inversion and two-dimensional (2-D) convolutions. Further reduction in computation is achieved by using a structure of IC patterns to define a set of building blocks or basis functions from which any IC pattern can be constructed, and which is followed by producing images of IC patterns from the "pre-images" of the building blocks. The concept of exploiting the structure of IC patterns for fast image simulation for optical proximity correction (OPC) of masks is described by N. Cobb et al. in the article "Fast low-complexity mask design", published in the Proceedings of SPIE Microlithography Conference, February 1995, pp. 313–327. A key difference between the inventive method to be described hereinafter and the method described by N. Cobb et al. lies in the use of building block functions that have infinite support and which exploit the translation-invariance property of convolutions. The aforementioned prior art approach uses finitely supported rectangles, wherein each resizing of the rectangle must be handled individually, a distinct disadvantage. Other differences will be further elaborated hereinafter.

OBJECTS OF THE INVENTION

Accordingly, an object of the present invention is to provide aerial images for photolithographic simulation which can be advantageously produced during the exposure step of a photo-lithographic process in the design of a semiconductor integrated circuit wafer.

It is another object of the invention to provide an efficient computation of aerial images for large mask areas and for arbitrary photomask patterns.

It is a further object of the invention to provide a speed improvement of several orders of magnitude over more traditional and general approaches, such as SPLAT.

It is still another object of the invention to optimize stepper parameters by selecting an appropriate sampling interval (or grid) and sampling range to generate eigenvectors (also referred to as kernels) for fast aerial image computation.

It is yet another object of the invention to provide a method capable of defining the smallest characteristic matrix without sacrificing computation accuracy.

SUMMARY OF THE INVENTION

In a first aspect of the present invention there is provided a method of simulating aerial images of large mask areas during the fabrication of a semiconductor integrated circuit silicon wafer that includes the steps of defining mask patterns to be projected by an exposure system to create images of the mask patterns; calculating an optimum sampling interval for the exposure system; calculating an optimum sampling range for the exposure system; generating a characteristic matrix describing the exposure system; inverting the matrix to obtain eigenvalues and eigenvectors (or kernels) representing the decomposition of the exposure system; convolving the mask patterns with the eigenvectors; weighing the resulting convolution by the eigenvalues to form the aerial images; and summing up the weighted convolutions for generating a final set of aerial images of the patterns to be replicated on the silicon wafer to form the semiconductor IC chip.

In a second aspect of the invention, there is provided a method for generating aerial images of patterns of large mask areas that are to be replicated on a silicon wafer to form an IC chip, wherein a characteristic matrix has a precisely defined sampling range and sampling interval, such that the sampling range is determined to be the shortest possible and the sampling interval to be as large as possible.

In a third aspect of the invention, the restricted sampling range is defined by the equation:

$$c\lambda/(NA\sigma,)$$

wherein c is a constant bound by $0.6 \leq c \leq 10$, wherein $\lambda$ is the wavelength of the exposure system, $\sigma$ is the partial coherence factor of the exposure system, and NA is the numerical aperture of the exposure system.

In a fourth aspect of the invention, the sampling interval (or grid) is quantified by the equation:

$$d\lambda/[NA(1+\sigma)],$$

wherein the constant d is bound by $0.1 \leq d \leq 0.5$.

In a fifth aspect of the invention, the computed efficiency is inversely proportional to the number of sampling points n, which is given by twice the quotient between the sampling range and the sampling interval, as defined by the equation:

$$n=2(c/d).(1+\sigma)/\sigma.$$

BRIEF DESCRIPTION OF THE DRAWINGS

The features, aspects and advantages of the invention will be better understood from the following description taken in conjunction with the accompanying drawings, in which.

DETAILED DESCRIPTION OF A PREFERRED EMBODIMENT

Theory of Aerial Image Formation

Figure 1:
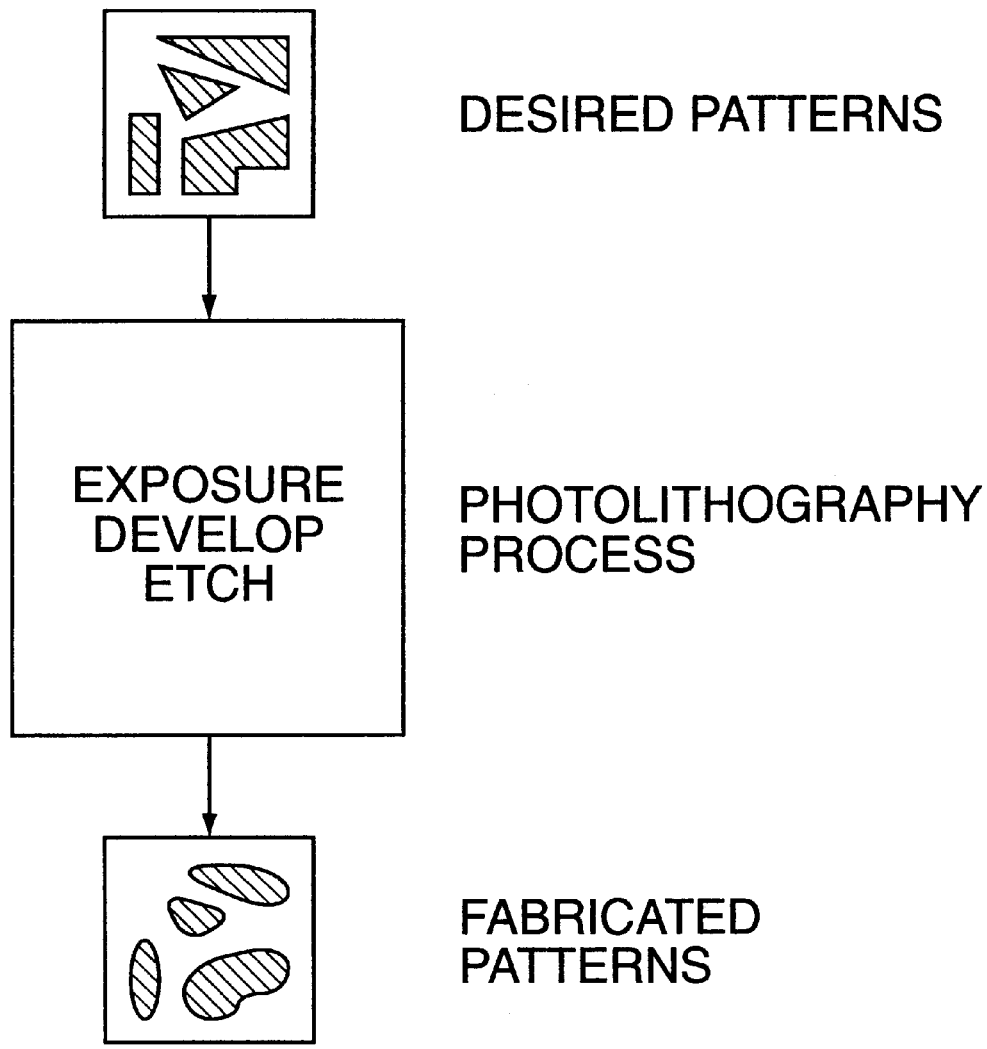
FIG. 1 shows a conventional break-up of the lithography process in three steps: exposure, develop and etch.
Figure 2:
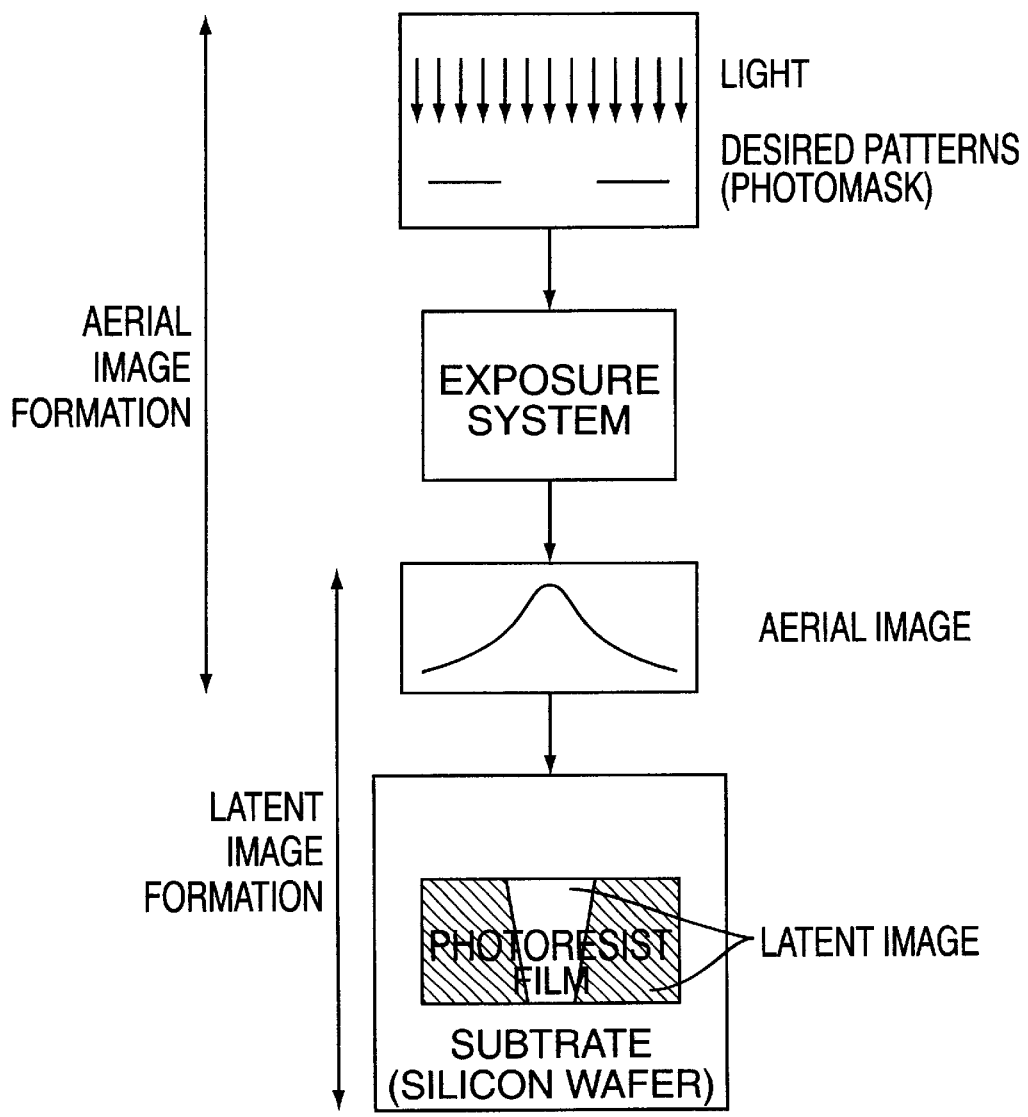
FIG. 2 shows a conventional break-up of the exposure step into two known steps: aerial image and latent image formation.
Figure 3:
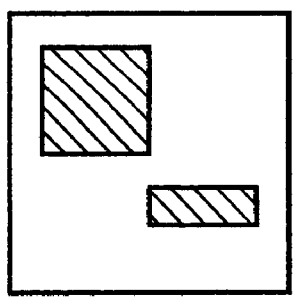
FIG. 3 shows typical distortions of the photomask patterns caused by the exposure system.
Figure 3:
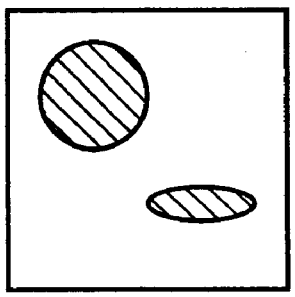

Aerial image formation can be described by the following basic equation 1:

$$I(x', y') = \tag{1}$$
$$\int\int\int_{-\infty}^{+\infty}\int J(x_a - x_b, y_a - y_b)P_0(x' - x_a, y' - y_a)P_0^*(x' - x_b, y' - y_b)O(x_a, y_a)$$
$$O^*(x_b, y_b)dx_a\,dy_a\,dx_b\,dy_b$$

where $J(x, y) = \int\int_{-\infty}^{+\infty}\tilde{J}(\alpha', \beta')e^{+i2\pi(\alpha'x+\beta'u)}d\alpha'\,d\beta'$ mutual intensity $\tilde{J}(\alpha', \beta')$ effective source distribution in pupil $$P_0(x, y) = \int\int_{-\infty}^{+\infty}\tilde{P}_0(\alpha', \beta')e^{+i2\pi(\alpha'x+\beta'u)}d\alpha'\,d\beta' \text{ point spread function} \tag{2}$$

$\tilde{P}_0(\alpha', \beta')$ pupil function $$O(x, y) = \int\int_{-\infty}^{+\infty}\tilde{O}(\alpha', \beta')e^{+i2\pi(\alpha'x+\beta'y)}d\alpha'\,d\beta' \text{ object intensity distribution} \tag{3}$$

$\tilde{O}(\alpha', \beta')$ object spectrum in pupil with $i=\sqrt{-1}$, denoting complex conjugation, (x', y') and ($\alpha'$, $\beta'$, $\gamma'$) representing, respectively, the image plane coordinates and directional cosines of the exit pupil, assuming that the optic axis is aligned with the z-axis and light propagates in the +z direction. Essentially, J(x,y) represents the light source of the exposure system, $Po_{(x,y)}$ describes the imaging of the exposure system, and $Po_{(x,y)}$ the function of the photomask patterns.

Aerial Image Calculation via Transmission Cross-coefficients (TCC)

For computation sake, equation 1 can be expressed by substituting equation 3 into equation 1. After some Mathematical manipulation, the following equation 4 results:

$$I(x', y') = \int\int\int_{-\infty}^{+\infty}\int T\tilde{C}C(\alpha_a, \beta_a; \alpha_b, \beta_b)\tilde{O}(\alpha_a, \beta_a) \tag{4}$$
$$\tilde{O}^*(\alpha_b, \beta_b)e^{-i2\pi((\alpha_a-\alpha_b)x'+(\beta_a-\beta_b)y')}d\alpha_a\,d\beta_a\,d\alpha_b\,d\beta_b$$

where $(5)$ $$T\tilde{C}C(\alpha_a, \beta_a; \alpha_b, \beta_b) =$$
$$\int\int_{-\infty}^{+\infty}\tilde{J}(\alpha_c, \beta_c)\tilde{P}(\alpha_c + \alpha_a, \beta_c + \beta_a)\tilde{P}^*(\alpha_c + \alpha_b, \beta_c + \beta_b)d\alpha_c\,d\beta_c$$

are called the transmission cross-coefficients (TCCs).
are referred to as transmission cross-coefficients (see *Principles of Oitics*, section 10.5, pp. 528–532, by M. Born et al., Pergamon Press, 6th. Edition, 1986).

In conventional approaches such as the previously mentioned SPLAT, the object is assumed to be periodic (Note: non-periodic objects are presupposed to possess a large period) such that the object spectrum $O(\alpha',\beta')$ becomes discrete:

$$\bar{O}(\alpha', \beta') = \sum_{m,n}c_{m,n}\delta\left(\alpha' - \frac{m}{p_x}, \beta' - \frac{n}{p_y}\right)$$

wherein $p_x$ and $p_y$ are respectively the spatial period in the x and y directions. With the expansion for $O(\alpha',\beta')$, equation 4 becomes:

$$I(x', y') = \sum_{m_a,n_b}\sum_{m_b,n_b}T\tilde{C}C\left(\frac{m_a}{p_x}, \frac{n_a}{p_y}, \frac{m_b}{p_x}, \frac{n_b}{p_y}\right) \tag{6}$$

-continued
$$c_{m_a,n_a}c^*_{m_b,n_b}e^{-i2\pi\left((m_a-m_b)\frac{x'}{p_x}+(n_a-n_b)\frac{y'}{p_y}\right)}$$

Figure 4:
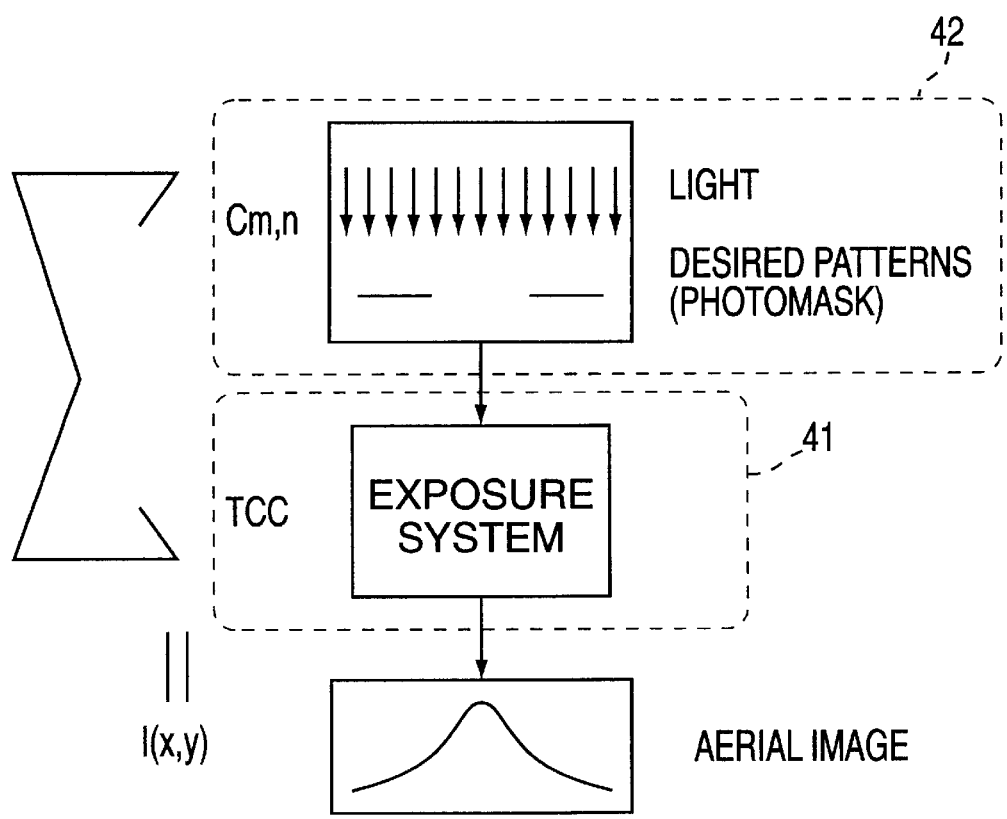
FIG. 4 is a block diagram of a prior art simulation process described with reference to equation 6 (i.e., SPLAT computation)

The image calculation can thus be separated into two parts: one concerning the exposure system involving the calculation of the transmission cross-coefficients TCC($\alpha$, $\beta$; $\alpha$, $\beta$) (41), and the other involving the object requiring the computation of the discrete Fourier coefficients of the object ($C_{m,n}$) (42). This process is illustrated in FIG. 4.

With this formulation, image computation time scales as the square of the object area (or fourth power of the linear dimension) due to the fourfold integral in equation 6, which leads to an unacceptable computation time for simulation of large mask areas.

Aerial Image Computation via Optical Coherent Decomposition (OCD)

The long computation time for large area simulation can be partially solved by integrating equation 1 in an alternative manner. Expressing equation 1 as:

$$I(x', y') = \tag{7}$$
$$\int\int\int_{-\infty}^{+\infty}\int W(x' - x_a, y' - y_a; x' - x_b, y' - y_b)O(x_a, y_a)O^*(x_b, y_b)$$
$$dx_a\,dy_a\,dx_b\,dy_b$$

where $$W(x_a,y_a;x_b,y_b)=J(x_b-x_a,y_b-y_a)P_O(x_a,y_a)P^*_O(x_b,y_b)$$

the aerial image computation becomes a convolution operation expressed by the following equation 8:

$$I(x', y') = \int\int\int_{-\infty}^{+\infty}\int\sum_{k=1}^{\infty}\lambda_k\varphi_k(x' - x_a, y' - y_a) \tag{8}$$
$$\varphi^*_k(x' - x_b, y' - y_b)O(x_a, x_b)O^*(x_b, y_b)dx_a\,dy_a\,dx_b\,dy_b$$
$$= \sum_{k=1}^{\infty}\lambda_k\left|\int\int_{-\infty}^{+\infty}\varphi_k(x' - x, y' - y)O(x, y)\,dxdy\right|^2$$
$$\approx \sum_{k=1}^{n_{kernel}}\lambda_k|(O\otimes\varphi_k)(x', y')|^2$$

where

-continued $$W(x_a, y_a; x_b, y_b) = \sum_{k=1}^{\infty} \lambda_k \varphi_k(x_a, y_a) \varphi_k^*(x_b, y_b)$$

$\lambda_k$'s and the $\phi_k(x,y)$'s represent the eigenvalues and eigenvectors of the characteristic matrix W $(x_a,y_a;x_b,y_b)$. The convolution computation is fast; the only difficulty with this approach lies in providing an efficient calculation of the eigenvalues and eigenvectors of $W(x_a,y_a;x_b,y_b)$ by matrix inversion. This method (illustrated in FIG. 5) is referred to as Optical Coherent Decomposition (OCD) because the exposure system is modeled as a sum of n coherent systems represented by the kernels $\phi_k(x,y)$'s.

Figure 5:
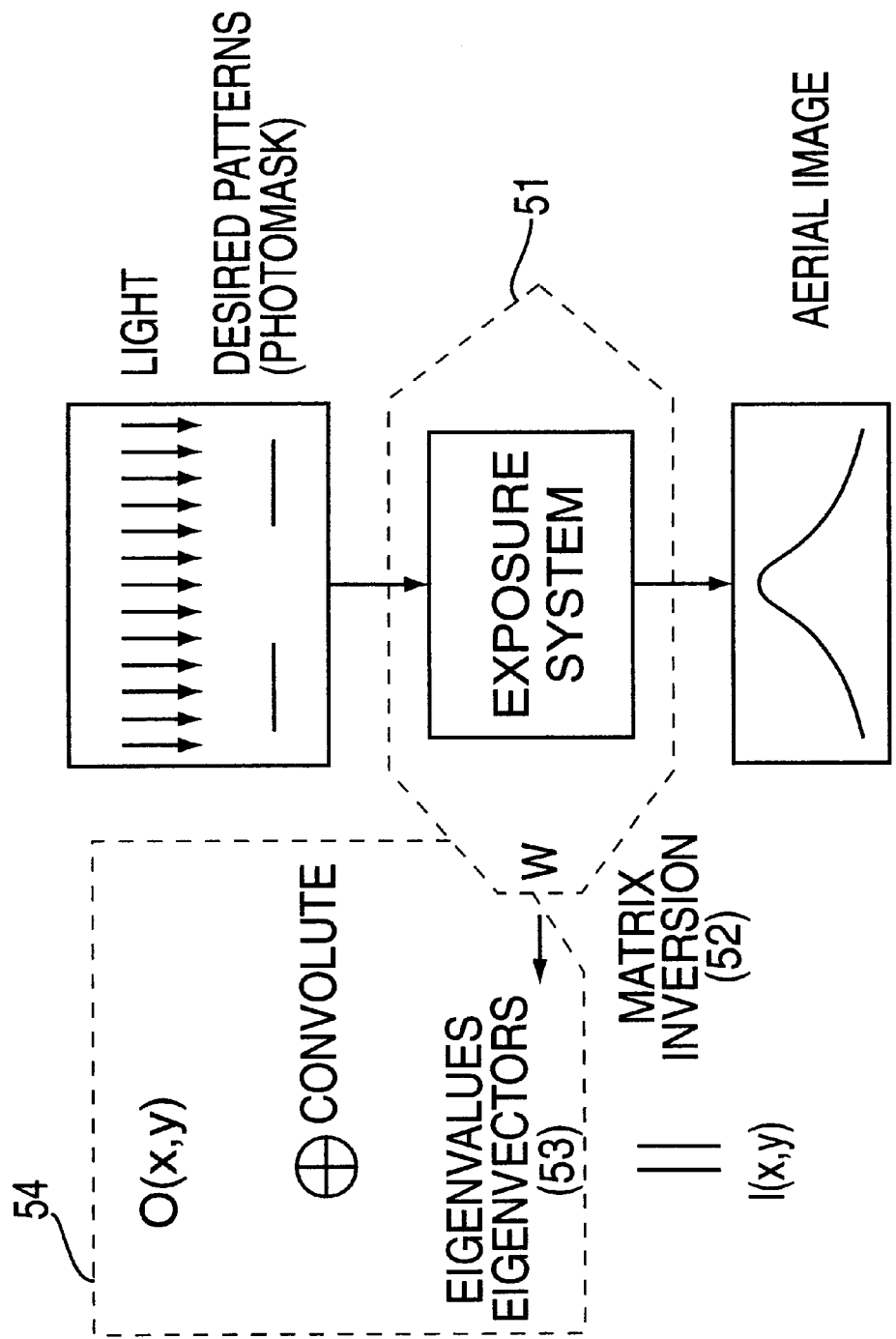
FIG. 5 is a block diagram of another prior art simulation process described with reference to equation 8 (i.e., Pati's computation)

FIG. 5 shows the simulation process expressed by equation 8 and how it operates, wherein during the exposure step, a matrix formation (51) followed by the inversion of the matrix (52) are shown. The output of these steps leads to obtaining a series of eigenvalues and eigenvectors (53). These eigenvalues are subsequently convolved with the photomask function, the result of which provides an aerial image expressed by the equation 8. Since matrix inversion time increases as the third power of the matrix dimension, significant time savings can be obtained with a small matrix $W(x_a,y_a;x_b,y_b)$. Nevertheless, accuracy puts a lower bound on the dimension of $W(x_a,y_a; x_b,y_b)$. In a published implementation by Y. C. Pati et al., "Exploiting structure in fast aerial computation for integrated circuit patterns", IEEE Transaction of Semiconductor Manufacturing, Vol. 10, pp. 62–74, February 1997, an interval of 20 nm covering a range of 440 nm with an exposure wavelength of 365 nm is utilized, resulting in 45 samples along the x and y-directions (Note: this sampling interval of 20 nm is intuitive since one expects a sampling interval of approximately a tenth of the minimum pattern dimension in order to represent the aerial image appropriately). This sampling interval gives rise to a $W(x_a,y_a;x_b,y_b)$ matrix of dimension 2025, requiring hours of computation on state of the art serial computers. Nevertheless, the calculated eigenvalues and eigenvectors can be precomputed and stored for a particular imaging system at a particular focus level, making this approach efficient for large area aerial image computation, provided only one exposure system is used at a fixed focus.

The problem with the approach expressed by equation 8 is the need to invert a big matrix for various exposure systems, such as for systems having different illumination configurations or for systems with the same parameters, but having different aberration characteristics, or even for systems with the same parameters and aberration characteristics but imaging at different focal planes. The approach becomes inefficient in such situations.

The size of the characteristic matrix $W(x_a,y_a;x_b,y_b)$ is proportional to two parameters: the sampling interval and the sampling range. Typically, the denser the sampling interval and the longer the sampling range, the more accurate the calculation. However, both translate in a larger characteristic matrix. Described herein-after, is a method for defining the smallest characteristic matrix without sacrificing computational accuracy.

Sampling Interval

The required spatial sampling interval depends on the wavelength ($\lambda$), numerical aperture (NA) and partial coherence ($\sigma$) of the exposure system. It can be derived using the principles of the Whittaker-Shannon sampling theorem, well known in the art. Since the imaging system is band-limited, i.e., it passes low spatial frequencies but cuts off high frequencies, the sampling interval is given by:

$$\frac{d\lambda}{NA(1+\sigma)} \qquad (9)$$

where d≈0.5.

For the exposure system described in the prior art article by Y. C. Pati, et al. ($\lambda$=365 nm, NA=0.54 and $\sigma$=0.3), equation 9 results in a non-intuitive sampling interval of 260 nm rather than the conventional 20 nm, a difference of a factor of 13.

Sampling Range

For partially coherent systems, optical interaction among patterns on the photomask has a finite range. In aerial image computation, the use of a sampling range smaller than the interaction range results in inaccurate calculation. On the other hand, the use of an unnecessarily large sampling range increases the size of the characteristic matrix and, hence, reduces computation efficiency. This interaction range is not constant but depends on exposure system parameters. Therefore, it is important to calculate the correct interaction range in order to determine an accurate and, yet, efficient sampling range. For partially coherent systems, the optical interaction range is given by $$c \cdot \frac{\lambda}{NA\sigma} \qquad (10)$$

where c≈0.61, representing the first 0 of the Bessel function.

For a like exposure system as that described in the above section, the sampling range is 1375 nm rather than the inaccurate 440 nm used in the prior art.

Efficiency

The computation efficiency e is inversely related to the third power of the number of sampling points n, which is given by twice the quotient between the optical interaction range (i.e., the sampling range) of equation 10 and the sampling interval of equation 9:

$$n = 2\frac{c}{d} \cdot \frac{(1+\sigma)}{\sigma} \qquad (11)$$

where n is the number of required sampling points. For the exposure system described above, the number of sampling points is 11, as opposed to 45 stated in the prior art. This results in a characteristic matrix of dimension 121 rather than 2025, leading to a matrix inversion time improvement of 3000.

Formation of the Characteristic Matrix

Figure 6:
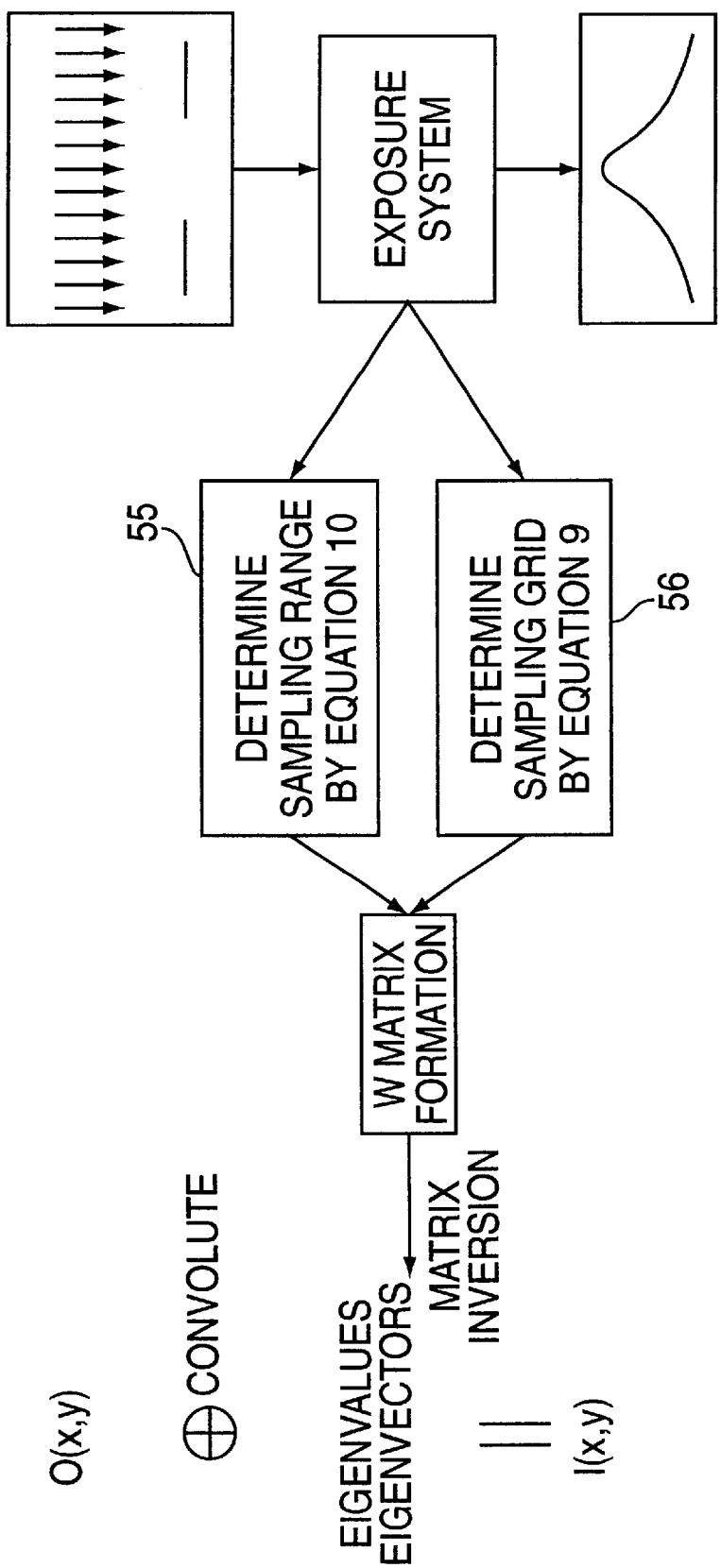
FIG. 6 is a block diagram of the simulation process in accordance with the present invention, wherein the steps of determining an optimum sampling interval and sampling range have been added.

Referring now to FIG. 6, there is shown a restructured and modified version of the block diagram of FIG. 5, in accordance with the invention.

Therein are illustrated blocks 55 and 56 representing two subroutines added to the process described with reference to FIG. 5 and which are instrumental to calculate an optimum sampling range and sampling interval.

As previously mentioned, the parameters of the exposure system, such as the wavelength $\lambda$, the numerical aperture NA and the partial coherence factor $\sigma$, are defined as part of the specification defining the exposure system.

The computation of the sampling interval and sampling range is performed in the following manner:

The ratio of the pupil fill of the condenser optics to the pupil fill of the projection optics is determined to obtain the partial coherence factor $\sigma$.

The constant d is first determined such that the resulting characteristic matrix is sufficiently dense to capture the imaging characteristic of the exposure system and, yet, sparse enough to ensure an adequate efficiency factor (previously described with respect to the number of sampling points n) Since each exposure system can be viewed as a low pass filter, there is a minimum sampling interval beyond which no benefit in accuracy is gained.

The sampling interval is then calculated from the Whittacher-Shannon theorem. The constant d thus obtained is typically $\leq 0.5$.

Figure 7:
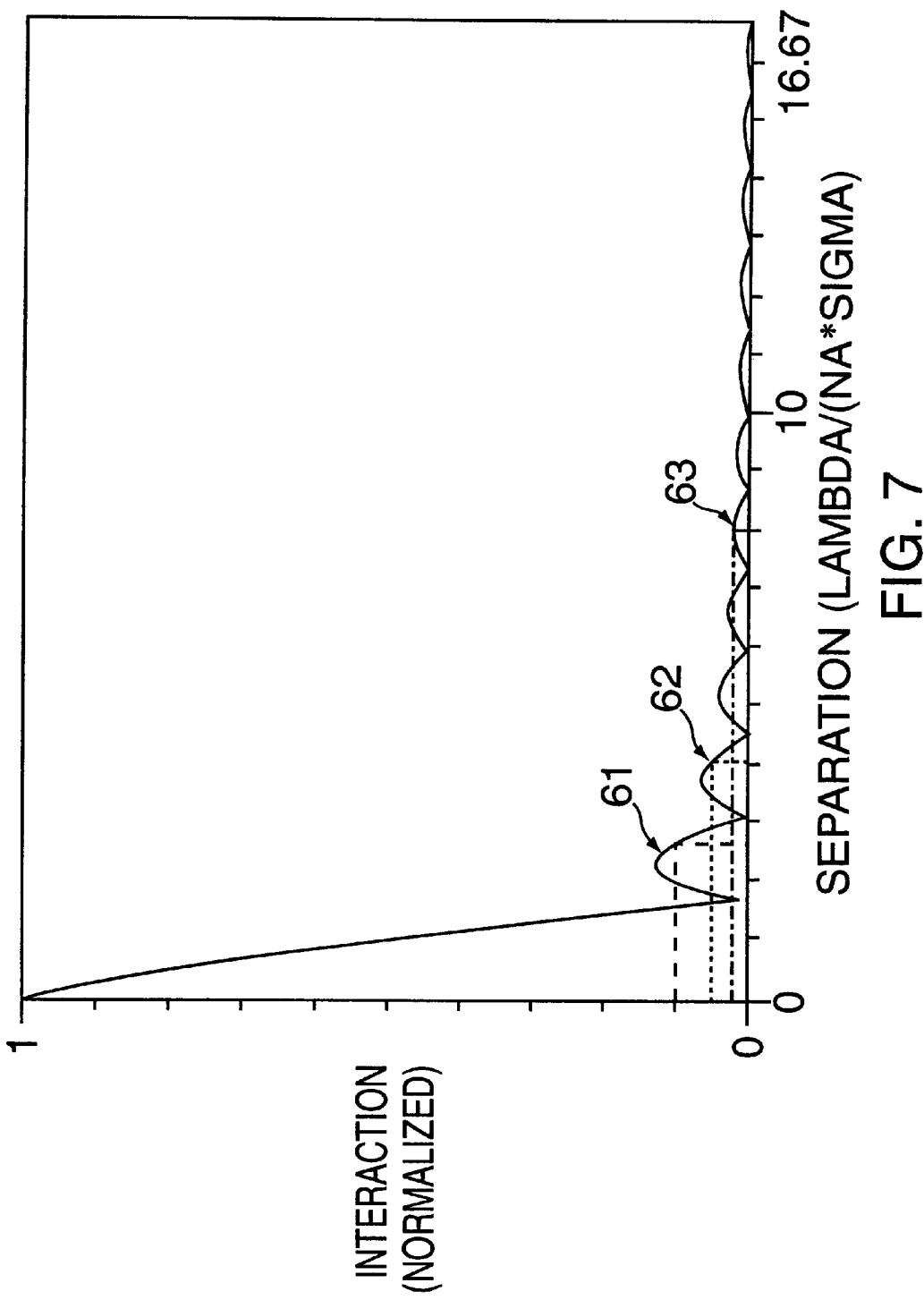
FIG. 7 is a plot of the magnitude of the complex degree of coherence of two points as a function of their separation.

The sampling range is obtained next using the plot shown in FIG. 7, i. e., the magnitude of the complex degree of coherence of two points as a function of their separation. Practitioners in the art will fully appreciate that such parameters and, correspondingly, the plot varies from one exposure system to the next. For the example of FIG. 7, $\lambda=0.248 \mu m$, NA=0.6 and $\sigma=0.6$.

From the plot, the user determines the sampling range based on the fraction of interaction below which the aerial images are not significantly affected. This is a subjective consideration, typically, in the range of 1% to 5%, but rarely exceeds 10%.

The above graph has an x-axis showing the distance between two points on a mask which determines the amount of interaction. The y-axis shows the normalized amount of interaction between the two points on the mask.

Accordingly, an optimum sampling range is determined at an interval large enough that the amount of interaction between adjoining points (or features) on the mask play an insignificant role. Using the plot of FIG. 7, if the user selects a fraction of 0.05 (5%), the sampling range will be 4.03λ/NAσ, with c=4.03 (point 62). If the user selects 10%, c=2.6 (point 61), and for 2%, c8.07 (point 63).

From the sampling range and sampling interval, the characteristic matrix is assembled, inverted, convoluted, etc., as was previously described.

Whereas the invention has been described with only one embodiment, it is understood that the same is not limited thereto but it is susceptible to changes and modifications as known to one having ordinary skills in the art. It is therefore not limited to the details shown and described herein, but its intent is to cover all such modifications as are encompassed by the scope of the appended claims.

What is claimed is:

1. A method of simulating aerial images of large mask areas during the fabrication of a semiconductor integrated circuit silicon wafer comprising the steps of:

defining mask patterns to be projected by an exposure system to create images of said mask patterns;

calculating an optimum sampling interval;

and an optimum sampling range for said exposure system, said optimum sampling interval and said optimum sampling range being directly proportional to λ, wherein λ represents the wavelength of said exposure system, and inversely proportional to σ and NA, wherein σ and NA are respectively the partial coherence factor and the numerical aperture of said exposure system;

generating a characteristic matrix describing said exposure system based on said optimum interval and said optimum sampling range;

inverting said matrix to obtain eigenvalues and eigenvectors representing a decomposition of said exposure system;

convolving said mask patterns with said eigenvectors;

weighing the resulting convolution by said eigenvalues; and summing up said weighted convolutions for generating a final set of said aerial images of said patterns to be replicated on said silicon wafer to form said semiconductor integrated circuit silicon wafer.

2. The method as recited in claim 1, wherein said optimum sampling interval is expressed by:

$$\frac{d\lambda}{NA(1+\sigma)}$$

wherein d is a constant between $0.1 \leq d \leq 0.5$.

3. The method as recited in claim 1, wherein said optimum sampling range is expressed by:

$$\frac{c\lambda}{NA\sigma}$$

wherein c is a constant between $0.6 \leq c \leq 10$.

4. The method as recited in claim 1, wherein said constants c and d define a number of sampling points n of said characteristic matrix, said n being given by the equation:

$$n = 2\frac{c}{d} \cdot \frac{(1+\sigma)}{\sigma}.$$

5. The method as recited in claim 4, wherein c and d are approximately equal to 0.5 and 0.61, respectively.

6. The method as recited in claim 4, wherein a computation efficiency factor is inversely related to the third power of said number of sampling points.

7. The method as recited in claim 1, wherein said large mask areas are obtained during an exposure step of a photo-lithographic process and are subsequently replicated on said silicon wafer.

8. The method as recited in claim 1, further comprising the step of forming latent images by propagating said aerial images into photoresist.

* * * * *